(12) United States Patent
Rule et al.

(10) Patent No.: US 11,243,098 B2
(45) Date of Patent: Feb. 8, 2022

(54) CONFIGURABLE NODES FOR SENSING SYSTEMS

(71) Applicant: Simmonds Precision Products, Inc., Vergennes, VT (US)

(72) Inventors: Benjamin T. Rule, Vergennes, VT (US); Travis Gang, Hinesburg, VT (US); Thomas Henck, Huntington, VT (US); Travis DeMent, Burlington, VT (US); Peter J. Carini, Underhill, VT (US); Daniel Hiatt, South Burlington, VT (US); Benjamin D. Mcbride, South Burlington, VT (US); Matthew B. Burleigh, Essex, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 278 days.

(21) Appl. No.: 16/271,304

(22) Filed: Feb. 8, 2019

(65) Prior Publication Data
US 2020/0256710 A1    Aug. 13, 2020

(51) Int. Cl.
G01D 9/00    (2006.01)
H03K 19/17724    (2020.01)

(52) U.S. Cl.
CPC ....... G01D 9/005 (2013.01); H03K 19/17724 (2013.01)

(58) Field of Classification Search
CPC .......................... G01D 9/005; H03K 19/17724
See application file for complete search history.

(56) References Cited

U.S. PATENT DOCUMENTS

| | | |
|---|---|---|
| 5,005,142 A | 4/1991 | Lipchak et al. |
| 6,717,541 B1 | 4/2004 | Carter-Lewis et al. |
| 7,017,861 B1 | 3/2006 | Johansson et al. |
| 7,705,725 B2 | 4/2010 | Matsen et al. |
| 8,144,005 B2 | 3/2012 | Hu et al. |
| 8,661,923 B1 | 3/2014 | Willett et al. |
| 8,671,133 B2 | 3/2014 | Krikorian et al. |
| 8,682,509 B2 | 3/2014 | Goodrich et al. |
| 9,137,038 B1 | 9/2015 | Mazuk et al. |
| 9,489,340 B2 | 11/2016 | Safa-Bakhsh et al. |

(Continued)

OTHER PUBLICATIONS

Virk et al., Functional Testing of Wireless Sensor Node Design, IEEE, p. 123-127, 2008 (Year: 2008).*

(Continued)

*Primary Examiner* — Raymond L Nimox
(74) *Attorney, Agent, or Firm* — Locke Lord LLP; Scott D. Wofsy; Georgi Korobanov

(57) ABSTRACT

A sensor node for a distributed sensing system, can include a physical memory configured to store configuration settings data, one or more sensor channels configured to interface with one or more physical sensors to receive signals from the one or more physical sensors, and one or more configurable logic modules connected to the physical memory and operative to receive the configuration settings data and to be configured by the configuration settings data into a logic state to control whether and/or how the one or more one or more configurable logic modules receive and/or processes data from the one or more sensor channels. The one or more configurable logic modules can include one or more FPGAs and/or PLDs, for example.

16 Claims, 2 Drawing Sheets

(56) References Cited

U.S. PATENT DOCUMENTS

| | | | |
|---|---|---|---|
| 10,033,388 B1* | 7/2018 | Rawat | G11C 5/148 |
| 10,078,955 B1 | 9/2018 | Gang et al. | |
| 10,196,152 B2 | 2/2019 | Gang et al. | |
| 2003/0074489 A1* | 4/2003 | Steger | G01D 9/005 |
| | | | 710/1 |
| 2003/0163298 A1 | 8/2003 | Odom et al. | |
| 2005/0242836 A1* | 11/2005 | Goetting | G01R 31/318516 |
| | | | 326/39 |
| 2006/0020774 A1 | 1/2006 | Ramos et al. | |
| 2011/0071794 A1 | 3/2011 | Bronczyk et al. | |
| 2011/0313580 A1* | 12/2011 | Bakhmach | G05B 9/03 |
| | | | 700/292 |
| 2012/0101776 A1 | 4/2012 | Brower et al. | |
| 2012/0166789 A1 | 6/2012 | Baxi et al. | |
| 2013/0342355 A1* | 12/2013 | Lund | H04W 4/70 |
| | | | 340/870.01 |
| 2016/0026173 A1 | 1/2016 | Willis et al. | |
| 2017/0067860 A1 | 3/2017 | Grabill et al. | |
| 2020/0192603 A1* | 6/2020 | Tanriover | G06F 9/466 |

OTHER PUBLICATIONS

Extended European search report issued in corresponding EP application No. 19214951.6, dated Jul. 8, 2020.
Kashif Virk et al: "Functional Testing of Wireless Sensor Node Designs",Innovations in Information Technology, 4th International Conference on, IEEE, PI,Nov. 1, 2007 (Nov. 1, 2007), pp. 123-127, XP031202321.

* cited by examiner

CONFIGURABLE NODES FOR SENSING SYSTEMS

BACKGROUND

1. Field

This disclosure relates to sensing systems, e.g., nodes for sensing systems.

2. Description of Related Art

Traditional monitoring systems consist of a single federated unit located in an aircraft compartment connected to a variety of sensors and communication buses. This unit collects, processes and records data from sensors located across the entire aircraft. While these units are highly functional they present challenges for continuous advancement, such as scalability, flexibility, mass reduction, and cost reduction.

Such conventional methods and systems have generally been considered satisfactory for their intended purpose. However, there is still a need in the art for improved sensing systems and nodes therefore. The present disclosure provides a solution for this need.

SUMMARY

A sensor node for a distributed sensing system, can include a physical memory configured to store configuration settings data, one or more sensor channels configured to interface with one or more physical sensors to receive signals from the one or more physical sensors, and one or more configurable logic modules connected to the physical memory and operative to receive the configuration settings data and to be configured by the configuration settings data into a logic state to control whether and/or how the one or more one or more configurable logic modules receive and/or processes data from the one or more sensor channels. The one or more configurable logic modules can include one or more FPGAs and/or PLDs (programmable logic devices), for example.

The one or more FPGAs and/or PLDs can include a low power FPGA and/or PLD and a normal power FPGA and/or PLD each connected to the physical memory. The low power FPGA and/or PLD can be configured to operate a reduced amount of the one or more sensor channels and/or at reduced sample rate.

The one or more sensor channels can include one or more integral sensor channels. The sensor node can further include an integral sensor bank having one or more integral physical sensors operatively connected to each of the low power FPGA and/or PLD and the normal power FPGA and/or PLD.

The one or more sensor channels can include one or more external sensor channels configured to operatively connect to one or more external physical sensors to receive one or more signals therefrom. At least one of the one or more external sensor channels can include one or more of a multiplexer (MUX) configured to connect to the one or more external sensors, a channel FPGA and/or PLD connected to low power FPGA and/or PLD and the normal power FPGA and/or PLD, an analog-to-digital converter (ADC) connected between the MUX and the channel FPGA and/or PLD, a digital-to-analog converter (DAC) connected between the MUX and the channel FPGA and/or PLD, a transceiver connected between the channel FPGA and/or PLD and the MUX, and an integral temperature sensor connected to the channel FPGA and/or PLD. Any suitable components for each internal and/or external sensor channel is contemplated herein.

The sensor node can include one or more transceivers connected to the one or more FPGAs and/or PLDs to receive updated configuration settings data to be stored on the physical memory. The one or more transceivers can be configured to output sensor data.

The sensor node can include a power switch configured to be controlled to selectively provide power to the normal power FPGA and/or PLD. The low power FPGA and/or PLD can be configured to operate the power switch to selectively supply power to the normal power FPGA and/or PLD. The sensor node 100 can include a channel power control module 135 configured to be connected to and controlled by the one or more configurable logic modules 111, 113 to control power supply to the one or more channels 105*a-d*. In certain embodiments, the sensor node 100 can include an ADC 137 and a RAM memory 139 connected to the normal power FPGA and/or PLD 113. Any other suitable component(s) to perform any suitable function(s) are contemplated herein.

The sensor node 100 can include non-application specific firmware and/or software in the physical memory, for example. In certain embodiments, the sensor node 100 can be configured to receive configuration settings and/or operational control commands, perform analog, discrete, and/or digital sensor data acquisitions on one or more data channels according to received configuration settings data and/or operation control commands, and process data from acquisitions according to received configuration settings data and/or operation control commands.

The sensor node 100 can be configured to enter a listening mode according to listening mode configuration setting. In the listening mode, the sensor node can be configured to continually digitize and retain an amount of past sensor data, monitor recorded raw and/or processed sensor data for behavior indicating the occurrence of an event for each predetermined sensor type attached to the one or more sensor channels, and if an event is detected on one or more of the sensor channels, the sensor node can exit the listening mode, retains some or all of the recorded past data, and records a specified amount of additional data.

The one or more physical sensors can be connected to the one or more sensor channels and configured to output sensor signals to the one or more sensor channels. The one or more physical sensors can include at least one of an ultrasonic sensor configured to provide one or more of ultrasonic sensing capability for use in structural health monitoring, an accelerometer configured to provide acceleration sensing capability, a strain gage, a temperature sensor, a position sensor, a tachometer sensor, an index sensor, a magnetic pickup, a pressure sensor, a load sensor, an optical sensor, a discrete input/output sensor of Ground/Open, or a discrete input/output sensor with a range of 0.01-30 volts/Open.

The one or more sensor channels can include a plurality of sensor channels that are configurable to interface with and collect data from at least one of one or more external analog sensors, one or more digital sensors, or one or more control modules. At least one of the sensor channels can be configured to interface with a discrete control module of a line replaceable unit (LRU) of a transportation vehicle. The sensor node can be configured to control the discrete control module and thus the actions of the LRU based upon the configuration settings data or an operational command received.

The node can include one or more internal sensors used for monitoring the health and/or usage of the node. The node can be configured to provide data back to a controller over the network data bus according to received configuration settings or operational commands over the network.

A computer implemented method for configuring a sensor node in a distributed sensor network can include receiving sensor node configuration settings data at a configurable logic module of a sensor node, and configuring the configurable logic module from a first logic state to a second logic state based on the configuration setting data to control whether and/or how the one or more one or more configurable logic modules receive and/or processes data from one or more sensor channels. In certain embodiments, the method can include operating the sensor node in a low power mode or a normal power mode as a function of the configuration settings data.

In certain embodiments, the method can include receiving data from one or more sensor channels and processing the data from the one or more sensor channels based on the configuration settings data. In certain embodiments, the method can include selecting which of a plurality of sensor channels to receive data from for processing based on the configuration settings data.

In accordance with at least one aspect of this disclosure, a distributed sensor node system can include a plurality of distributed sensor nodes operable to be configured to function based on configuration settings data and to output sensor data, at least one host operatively connected to each distributed sensor node and configured to provide configuration settings data to each of the plurality of sensor nodes, and a master host module connected to the host, the host configured to receive and compile sensor data from the plurality of sensor nodes and output sensor data on a common line to a master host module. Any suitable sensor node (e.g., as described above) and/or any other suitable components for the system are contemplated herein.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
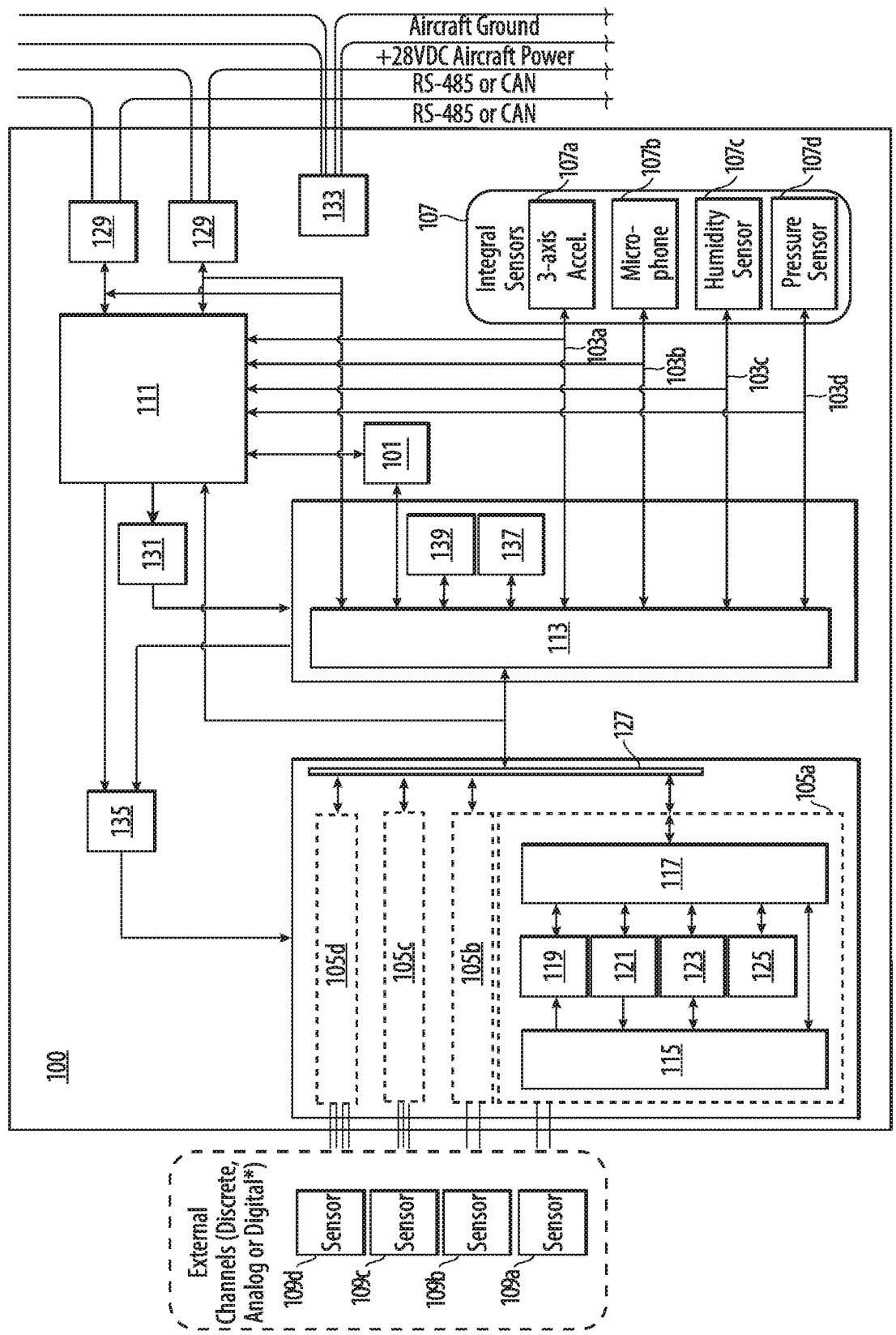
FIG. 1 is a schematic diagram of an embodiment of a sensor node in accordance with this disclosure.
Figure 2:
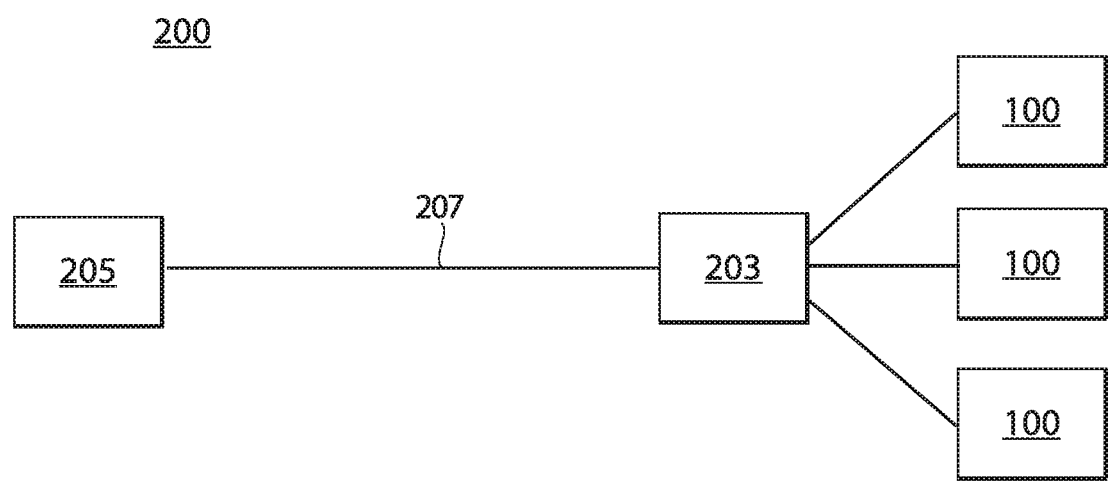
FIG. 2 is a schematic diagram of an embodiment of a distributed sensor system in accordance with this disclosure.

Reference will now be made to the drawings wherein like reference numerals identify similar structural features or aspects of the subject disclosure. For purposes of explanation and illustration, and not limitation, an illustrative view of an embodiment of a sensor node in accordance with the disclosure is shown in FIG. 1 and is designated generally by reference character 100. Other embodiments and/or aspects of this disclosure are shown in FIG. 2. Certain embodiments described herein can be used to, e.g., provide sensor nodes with modifiable configurations to perform any desired function.

Referring to FIG. 1, a sensor node 100, e.g., for a distributed sensing system (e.g., as shown in FIG. 2), can include a physical memory 101 configured to store configuration settings data. The physical memory can include any suitable data storage medium (e.g., a non-transitory computer readable medium such as but not limited to flash memory) as appreciated by those having ordinary skill in the art.

The sensor node 100 can include one or more sensor channels 103a, b, c, d, 105a, b, c, d configured to interface with one or more physical sensors 107a, b, c, d, 109a, b, c, d to receive signals from the one or more physical sensors 107a, b, c, d, 109a, b, c, d. The one or more sensor channels 103a, b, c, d, 105a, b, c, d can include any include any suitable hardware module(s) and/or software module(s) configured to interface with the one or more sensors 107a, b, c, d, 109a, b, c, d.

The sensor node 100 can include one or more configurable logic modules 111, 113 connected to the physical memory 101 and operative to receive the configuration settings data. The one or more configurable logic modules 111, 113 include any suitable hardware module(s) and/or software module(s) that can be configured by the configuration settings data into a logic state to control whether and/or how the one or more one or more configurable logic modules 111, 113 receive and/or processes data from the one or more sensor channels 103a, b, c, d, 105a, b, c, d. The one or more configurable logic modules 111, 113 can include one or more FPGAs and/or PLDs, for example. Any other suitable configurable device as appreciated by those having ordinary skill in the art is contemplated herein.

The one or more FPGAs and/or PLDs can include a low power FPGA and/or PLD 111 and a normal power FPGA and/or PLD 113 each connected to the physical memory 101. The low power FPGA and/or PLD 111 can be configured to operate a reduced amount of the one or more sensor channels 103a, b, c, d, 105a, b, c, d and/or at reduced sample rate, for example. Any other suitable reduction in function to reduce power is contemplated herein. The normal power FPGA and/or PLD 113 can be configured to operate a full selection of sensor channels and/or at any desired sample rate in accordance with the configuration setting data.

In certain embodiments, the one or more sensor channels 103a, b, c, d, 105a, b, c, d can include one or more integral sensor channels 103a, b, c, d, for example. The sensor node 100 can further include an integral sensor bank 107 having one or more integral physical sensors 107a, b, c, d operatively connected to each of the low power FPGA and/or PLD 111 and the normal power FPGA and/or PLD 113. The integral physical sensors 107a, b, c, d can include one or more of an accelerometer (e.g., 3 axis), a microphone, a humidity sensor, or a pressure sensor, for example. Any other suitable sensor type is contemplated herein.

The one or more sensor channels 103a, b, c, d, 105a, b, c, d can include one or more external sensor channels 105a, b, c, d configured to operatively connect to one or more external physical sensors 109a, b, c, d to receive one or more signals therefrom. In certain embodiments, e.g., as shown, at least one of the one or more external sensor channels 109a, b, c, d can include one or more of a multiplexer (MUX) 115 configured to connect to the one or more external sensors 109a and a channel FPGA and/or PLD 117 connected to low power FPGA and/or PLD 111 and the normal power FPGA and/or PLD 113. At least one of the one or more external sensor channels 109a, b, c, d can include an analog-to-digital converter (ADC) 119 connected between the MUX 115 and the channel FPGA and/or PLD 117, a digital-to-analog converter (DAC) 121 connected between the MUX 115 and the channel FPGA and/or PLD 117, a transceiver 123 connected between the channel FPGA and/or PLD 117 and the MUX 115, and an integral temperature sensor 125 connected to the channel FPGA and/or PLD 117. Any other suitable component(s) for each internal and/or external sensor channel is contemplated herein. As shown, each external sensor channel 105a, b, c, d can be connected to the one or more FPGAs and/or PLDs 111, 113 via a bank multiplexer 127, and/or in any other suitable manner as appreciated by those having ordinary skill in the art in view of this disclosure.

The sensor node 100 can include one or more transceivers 129 connected to the one or more FPGAs and/or PLDs 111, 113 to receive updated configuration settings data to be stored on the physical memory 101. One or more of the transceivers 129 can be configured to output sensor data, e.g., to a control node further disclosed below.

The sensor node 100 can include a power switch 131 configured to be controlled (e.g., by the low power FPGA and/or PLD 111) to selectively provide power to the normal power FPGA and/or PLD 113. The low power FPGA and/or PLD 111 can be configured to operate the power switch 131 to selectively supply power to the normal power FPGA and/or PLD 111. The sensor node 100 can include a power supply module 133 (e.g., a DC-DC power supply) connected to any suitable portion of the sensor node 100 to supply power thereto (e.g., the FPGAs and/or PLDs 111, 113 and/or the one or more sensor channels).

In accordance with at least one aspect of this disclosure, the sensor node 100 can include non-application specific firmware and/or software in the physical memory 101, for example. In certain embodiments, the sensor node 100 can be configured to receive configuration settings and/or operational control commands, perform analog, discrete, and/or digital sensor data acquisitions on one or more sensor channels 103a, b, c, d, 105a, b, c, d according to received configuration settings data and/or operation control commands, and process data from acquisitions according to received configuration settings data and/or operation control commands.

In certain embodiments, the sensor node 100 can be configured to enter a listening mode according to listening mode configuration setting. In the listening mode, the sensor node 100 can be configured to continually digitize and retain an amount of past sensor data, monitor recorded raw and/or processed sensor data for behavior indicating the occurrence of an event for each predetermined sensor type attached to the one or more sensor channels, and if an event is detected on one or more of the sensor channels, the sensor node 100 can exit the listening mode, retains some or all of the recorded past data, and records a specified amount of additional data.

The sensor node 100 can include the one or more external physical sensors 109a-d connected to the one or more sensor channels 105a-d. The one or more external physical sensors 109a-d can be configured to output sensor signals to the one or more sensor channels 105a-d. The one or more physical sensors 109a-d can include at least one of an ultrasonic sensor configured to provide one or more of ultrasonic sensing capability for use in structural health monitoring. The one or more physical sensors 109a-d can include an accelerometer configured to provide acceleration sensing capability, a strain gage, a temperature sensor, a position sensor, a tachometer sensor, an index sensor, a magnetic pickup, a pressure sensor, a load sensor, an optical sensor, a discrete input/output sensor of Ground/Open, or a discrete input/output sensor with a range of 0.01-30 volts/Open. Any other suitable sensor type is contemplated herein. Embodiments of a node 100 can include gyroscopic sensor node configured to measures angular velocity, an optical tracking sensor node configured to measure rotorcraft dynamic blade passing times to determine blade height, an oil sensor node measures oil conductivity, oil dielectric constant, oil temperature, and/or oil level, an optical sensor node interfacing with an optical fiber capable of measuring a range of optical sensor inputs including strain, temperature, acceleration, pressure, position, indexing, force, air speed, and rotational speed. Any other suitable function for any suitable embodiment of a node 100 having any suitable sensors and/or configuration settings is contemplated herein.

As shown, the one or more sensor channels 109a-d can include a plurality of sensor channels that are configurable to interface with and collect data from at least one of one or more external analog sensors, one or more digital sensors, or one or more control modules. Any suitable number of sensors and/or channels therefor are contemplated herein. At least one of the sensor channels 105a-d can be configured to interface with a discrete control module of a line replaceable unit (LRU) of a transportation vehicle, for example (e.g., a pump, a motor, etc.). The sensor node 100 can be configured to control the discrete control module and thus the actions of the LRU based upon the configuration settings data or an operational command received.

The node 100 can include one or more internal sensors used for monitoring the health and/or usage of the node 100. The node 100 can be configured to provide data back to a controller (e.g., as shown in FIG. 2) over the network data bus according to received configuration settings or operational commands over the network.

Referring additionally to FIG. 2, in accordance with at least one aspect of this disclosure, a distributed sensor node system 200 can include a plurality of distributed sensor nodes, e.g., sensor node 100 as disclosed above, operable to be configured to function based on configuration settings data and to output sensor data. The system 200 can include at least one host 203 operatively connected to each distributed sensor node 100 and configured to provide configuration settings data to each of the plurality of sensor nodes 100. The system 200 can include a master host module 205 connected to the host 203, the host 203 configured to receive and compile sensor data from the plurality of sensor nodes 100 and output sensor data on a common line 207 to a master host module 205. Any suitable sensor node (e.g., as described above) and/or any other suitable components for the system 200 are contemplated herein.

In accordance with at least one aspect of this disclosure, a computer implemented method for configuring a sensor node in a distributed sensor network can include receiving sensor node configuration settings data at a configurable logic module of a sensor node, and configuring the configurable logic module from a first logic state to a second logic state based on the configuration setting data to control whether and/or how the one or more one or more configurable logic modules receive and/or processes data from one or more sensor channels. In certain embodiments, the method can include operating the sensor node in a low power mode or a normal power mode as a function of the configuration settings data.

In certain embodiments, the method can include receiving data from one or more sensor channels and processing the data from the one or more sensor channels based on the configuration settings data. In certain embodiments, the method can include selecting which of a plurality of sensor channels to receive data from for processing based on the configuration settings data.

Embodiments can include a monitoring system for use in a transportation vehicle having a controlling node and a plurality of actionable nodes distributed across a network with programmable logic device (PLD) and/or microprocessor with non-application specific firmware and/or software, memory, a custom partition in the PLD and/or microprocessor for hosting application specific firmware and/or software. Embodiments can be remotely configurable to receive configuration settings from the custom partition or external to the system, update the configuration settings of the nodes based on received configured settings or commands received from the custom partition or external to the system, control the actions of a sensor node LRU's line replaceable units connected on a sub-net data bus based on received configured settings or commands received from the custom partition or external to the system, process the data generated by sensor node LRU's based on received configured settings or commands received from the custom partition or external to the system, and/or pass data to the custom partition or external to the system based on received configured settings or commands received from the custom partition or external to the system.

The sensor node, e.g., 100 as described above, can be a configurable device with one or more integrated sensors and/or interfaces to one or more external analog, discrete, or digital sensor. The sensor node can digitize, processes, and stores the sensor(s) data in internal memory. Each sensor node can use volatile and/or non-volatile memory devices to store data and configuration settings. In certain embodiments, the sensor node can retain configuration settings specifying which type of memory device to use to store data. When commanded by the host over the data bus, the sensing node can send the digitized raw and/or processed data for the host using the data bus. The sensor node can have internal memory management to delete expired sensor data. The sensor node can retain a configuration setting specifying, when the memory device exceeds a programmable capacity value indicating it is nearing full capacity, to delete the oldest data only when it has been downloaded by a host and not store new data until sufficient memory resources are available, or to delete the oldest data to replace it with new data as it comes in. As shown in the system 200 of FIG. 2, a multitude of sensor nodes may be used as part of the sensing system.

In certain embodiments, a plurality of host and sensor node subnetworks can perform identical functions as a redundant measure to comply with high reliability considerations. Each host and node can perform a configurable set of built-in test (BIT) at startup, as initiated by a host, or on a continuous or periodic basis, for example. The BIT may be performed on circuit card assembly components within the host or node. The BIT may be performed on communication circuitry and communication data integrity. The BIT may be performed on external channel circuitry and channel data integrity. The BIT may be performed on electrical power circuitry and integrity. The BIT results may be stored by the host and/or node according to a configuration setting. The number of BIT failure results, number of BIT pass results, as well as the storage location of the BIT results can be configurable. The node BIT results may be transmitted to the host according to a configuration setting, either immediately upon detection or upon a BIT status request from a host, for example. The BIT results may initiate a configurable set of actions by the host or node.

In certain embodiments, each host can perform time synchronization of the sensor nodes in its subnetwork. The host can transmit a system time to the sensor node(s) via the data bus on a periodic or event-driven basis.

The sensor nodes can update their internal system time to match each system time update it receives from the host. All subsequent timestamped data uses the most recently received system time. Each host and node can use a predefined set of power consumption modes optimized to its current tasks. The nodes may toggle on or off circuit card assembly components according to the current power mode, e.g., FPGAs and/or PLDs, processors, memory devices, internal sensors, transceivers, microprocessors, circuit card heating elements, analog-to-digital converters (ADCs), digital-to-analog converters (DACs), etc. The nodes may autonomously transition to the lowest necessary power mode based on its current set of tasks. The host may command the node(s) to operate in a particular power mode. The nodes may have a configuration setting specifying the power modes available for use during operation.

Embodiments of a system can be used to perform Health and Usage Monitoring (HUMS) in aircraft which could include Rotor Track and Balance, Mechanical Diagnostics and Vibration Diagnostics. The system can be used to perform Prognostic and Health Management in aircraft, for example. The data resulting from the system can be used for cloud based data analytics. The communication methods of the system can include RS-485, CAN, Ethernet (e.g., for between controllers), optical, wireless, and any other suitable aircraft protocols, for example.

Embodiments include actionable nodes for use in a monitoring system in a transportation vehicle having a plurality of actionable nodes distributed across a network with each node.

Prior technologies relied on a single federated located in the aircraft to collect and process data from all pertinent data from sensors and communication buses. These systems are heavy, costly, and not easily scalable for a particular application. A distributed system of host and sensor nodes allows for a system to be design for a particular application with a wide range of sensor types, optimizing system size and cost for that application. The system is also expandable over time. Embodiments can be applicable for any distributed sensing system having daisy-chained primary and secondary (and additional) devices, for example.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

Any suitable combination(s) of any disclosed embodiments and/or any suitable portion(s) thereof are contemplated herein as appreciated by those having ordinary skill in the art.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A sensor node for a distributed sensing system, comprising:
   a physical memory configured to store configuration settings data;
   one or more sensor channels configured to interface with one or more physical sensors to receive signals from the one or more physical sensors; and
   one or more configurable logic modules connected to the physical memory and operative to receive the configuration settings data and to be configured by the configuration settings data into a logic state to control whether and how the one or more configurable logic modules receive and processes data from the one or more sensor channels, wherein the one or more FPGAs and PLDs include a low power FPGA and PLD and a normal power FPGA and PLD each connected to the physical memory, wherein the low power FPGA and PLD are configured to operate a reduced amount of the one or more sensor channels and at reduced sample rate, wherein the one or more sensor channels include one or more external sensor channels configured to operatively connect to one or more external physical sensors to receive one or more signals therefrom, and wherein at least one of the one or more external sensor channels include one or more of a multiplexer (MUX) configured to connect to the one or more external sensors, a channel FPGA and PLD connected to low power FPGA and PLD and the normal power FPGA and PLD, an analog-to-digital converter (ADC) connected between the MUX and the channel FPGA and PLD, a digital-to-analog converter (DAC) connected between the MUX and the channel FPGA and PLD, a transceiver connected between the channel FPGA and PLD and the MUX, and an integral temperature sensor connected to the channel FPGA and PLD.

2. The sensor node of claim 1, wherein the one or more configurable logic modules include one or more FPGAs and PLDs.

3. The sensor node of claim 1, wherein the one or more sensor channels include one or more integral sensor channels, the sensor node further comprising an integral sensor bank having one or more integral physical sensors operatively connected to each of the low power FPGA and PLD and the normal power FPGA and PLD.

4. The sensor node of claim 2, further comprising one or more transceivers connected to the one or more FPGAs and PLDs to receive updated configuration settings data to be stored on the physical memory, wherein the one or more transceivers are configured to output sensor data.

5. A sensor node for a distributed sensing system, comprising:
a physical memory configured to store configuration settings data;
one or more sensor channels configured to interface with one or more physical sensors to receive signals from the one or more physical sensors; and
one or more configurable logic modules connected to the physical memory and operative to receive the configuration settings data and to be configured by the configuration settings data into a logic state to control whether and how the one or more configurable logic modules receive and processes data from the one or more sensor channels, wherein the one or more FPGAs and PLDs include a low power FPGA and PLD and a normal power FPGA and PLD each connected to the physical memory, wherein the low power FPGA and PLD is configured to operate a reduced amount of the one or more sensor channels and at reduced sample rate; and, a power switch configured to be controlled to selectively provide power to the normal power FPGA and PLD, wherein the low power FPGA and PLD is configured to operate the power switch to selectively supply power to the normal power FPGA and PLD.

6. A sensor node for a distributed sensing system, comprising:
a physical memory configured to store configuration settings data;
one or more sensor channels configured to interface with one or more physical sensors to receive signals from the one or more physical sensors; and
one or more configurable logic modules connected to the physical memory and operative to receive the configuration settings data and to be configured by the configuration settings data into a logic state to control whether and how the one or more configurable logic modules receive and processes data from the one or more sensor channels, wherein the sensor node includes non-application specific firmware and software in the memory, wherein the sensor node is configured to receive configuration settings and operational control commands, perform analog, discrete, and digital sensor data acquisitions on one or more data channels according to received configuration settings data and operation control commands, and process data from acquisitions according to received configuration settings data and operation control commands, and wherein the sensor node is configured to enter a listening mode according to listening mode configuration setting, wherein in the listening mode, the sensor node continually digitizes and retains an amount of past sensor data, monitors recorded raw and processed sensor data for behavior indicating the occurrence of an event for each predetermined sensor type attached to the one or more sensor channels, and if an event is detected on one or more of the sensor channels, the sensor node exits the listening mode, retains some or all of the recorded past data, and records a specified amount of additional data.

7. The sensor node of claim 6, further comprising the one or more physical sensors connected to the one or more sensor channels and configured to output sensor signals to the one or more sensor channels, wherein the one or more physical sensors include at least one of an ultrasonic sensor configured to provide one or more of ultrasonic sensing capability for use in structural health monitoring, an accelerometer configured to provide acceleration sensing capability, a strain gage, a temperature sensor, a position sensor, a tachometer sensor, an index sensor, a magnetic pickup, a pressure sensor, a load sensor, an optical sensor, a discrete input/output sensor of Ground/Open, or a discrete input/output sensor with a range of 0.01-30 volts/Open.

8. The sensor node of claim 6, wherein the one or more sensor channels include a plurality of sensor channels and are configurable to interface with and collect data from at least one of one or more external analog sensors, one or more digital sensors, or one or more control modules.

9. The sensor node of claim 8, wherein at least one of the sensor channels is configured to interface with a discrete control module of a line replaceable unit (LRU) of a transportation vehicle, the sensor node being configured to control the discrete control module and thus the actions of the LRU based upon the configuration settings data or an operational command received.

10. The sensor node of claim 6, wherein the node can include one or more internal sensors used for monitoring the health and usage of the node.

11. The sensor node of claim 6, wherein the node is configured to provide data back to a controller over the network data bus according to received configuration settings or operational commands over the network.

12. A computer implemented method for configuring a sensor node in a distributed sensor network, comprising:
receiving sensor node configuration settings data at a configurable logic module of a sensor node, wherein the sensor node configuration data includes:
a physical memory configured to store configuration settings data;
one or more sensor channels configured to interface with one or more physical sensors to receive signals from the one or more physical sensors; and
one or more configurable logic modules connected to the physical memory and operative to receive the configuration settings data and to be configured by the configuration settings data into a logic state to control whether and how the one or more configurable logic modules receive and processes data from the one or more sensor channels; and
a power switch configured to be controlled to selectively provide power to the normal power FPGA and PLD, wherein the low power FPGA and PLD is configured to operate the power switch to selectively supply power to the normal power FPGA and PLD; and configuring the configurable logic module from a first logic state to a second logic state based on the configuration setting data to control whether and how the one or more configurable logic modules receive and processes data from one or more sensor channels, wherein.

13. The method of claim 12, further comprising operating in a low power mode or a normal power mode as a function of the configuration settings data.

14. The method of claim 12, further comprising receiving data from one or more sensor channels, and processing the data from the one or more sensor channels based on the configuration settings data.

15. The method of claim 12, further comprising selecting which of a plurality of sensor channels to receive data from for processing based on the configuration settings data.

16. A distributed sensor node system, comprising:
a plurality of distributed sensor nodes operable to be configured to function based on configuration settings data and to output sensor data, at least one of sensor nodes includes:
a physical memory configured to store configuration settings data;
one or more sensor channels configured to interface with one or more physical sensors to receive signals from the one or more physical sensors; and
one or more configurable logic modules connected to the physical memory and operative to receive the configuration settings data and to be configured by the configuration settings data into a logic state to control whether and how the one or more configurable logic modules receive and processes data from the one or more sensor channels; and
a power switch configured to be controlled to selectively provide power to the normal power FPGA and PLD, wherein the low power FPGA and PLD is configured to operate the power switch to selectively supply power to the normal power FPGA and PLD; and
at least one host operatively connected to each distributed sensor node and configured to provide configuration settings data to each of the plurality of sensor nodes; and
a master host module connected to the host, the host configured to receive and compile sensor data from the plurality of sensor nodes and output sensor data on a common line to a master host module.

\* \* \* \* \*